(12) United States Patent
Kai

(10) Patent No.: US 11,823,918 B2
(45) Date of Patent: Nov. 21, 2023

(54) SUBSTRATE PROCESSING METHOD AND SUBSTRATE PROCESSING APPARATUS

(71) Applicant: Tokyo Electron Limited, Tokyo (JP)

(72) Inventor: Akiko Kai, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 49 days.

(21) Appl. No.: 17/405,431

(22) Filed: Aug. 18, 2021

(65) Prior Publication Data
US 2022/0068670 A1    Mar. 3, 2022

(30) Foreign Application Priority Data

Aug. 28, 2020   (JP) .................................. 2020-144694

(51) Int. Cl.
*H01L 21/67* (2006.01)
*H01L 21/687* (2006.01)
*H10K 71/15* (2023.01)

(52) U.S. Cl.
CPC .. *H01L 21/67051* (2013.01); *H01L 21/68735* (2013.01); *H01L 21/68764* (2013.01); *H10K 71/15* (2023.02)

(58) Field of Classification Search
CPC ......... H01L 21/67051; H01L 21/68735; H01L 21/68764; H01L 51/0007; H01L 21/67028; H01L 21/6715; H01L 21/67253; H01L 21/67178; H01L 21/0273; B05C 5/0204; B05C 11/1005; B05C 13/02; B05D 1/002; G03F 7/30; G03F 7/162; G03F 7/168; H10K 71/15
See application file for complete search history.

(56) References Cited

U.S. PATENT DOCUMENTS

| | | | |
|---|---|---|---|
| 2001/0033895 A1* | 10/2001 | Minami | H01L 21/6715 118/52 |
| 2006/0068110 A1* | 3/2006 | Fukuda | H01L 21/6708 118/313 |
| 2014/0234782 A1* | 8/2014 | Oori | G03F 7/3021 430/325 |
| 2015/0352591 A1* | 12/2015 | Kanaoka | H01L 21/6715 427/425 |
| 2019/0317407 A1* | 10/2019 | Mizunoura | C23F 1/02 |
| 2021/0074538 A1* | 3/2021 | Zi | G03F 7/38 |

FOREIGN PATENT DOCUMENTS

JP    2012-156454 A    8/2012

* cited by examiner

*Primary Examiner* — Alexander Markoff
(74) *Attorney, Agent, or Firm* — Venjuris, P.C.

(57) ABSTRACT

A substrate processing method includes supplying a processing liquid to a peripheral edge of a surface of a substrate to form a processing film on the peripheral edge of the surface of the substrate; and bringing a molding solvent supplied to an inner region than a region of the surface of the substrate to which the processing liquid is supplied, into contact with an interface of the processing liquid that faces a central side of the surface.

16 Claims, 10 Drawing Sheets

SUBSTRATE PROCESSING METHOD AND SUBSTRATE PROCESSING APPARATUS

CROSS-REFERENCE TO RELATED APPLICATION

This application is based on and claims priority from Japanese Patent Application No. 2020-144694 filed on Aug. 28, 2020 with the Japan Patent Office, the disclosure of which is incorporated herein in its entirety by reference.

TECHNICAL FIELD

The present disclosure relates to a substrate processing method and a substrate processing apparatus.

BACKGROUND

Japanese Patent Application Laid-Open No. 2012-156454 describes a configuration in which a fluid is sprayed onto a hump formed on a resist material film in the outer periphery of a semiconductor substrate so as to crush the hump.

SUMMARY

A substrate processing method according to an aspect of the present disclosure is a substrate processing method of forming a processing film on a peripheral edge of a substrate surface. The method includes: supplying a processing liquid to a peripheral edge of a surface of a substrate to form the processing film on the peripheral edge of the surface of the substrate; and bringing a molding solvent supplied to an inner region than a region of the surface of the substrate to which the processing liquid is supplied into contact with an interface of the substrate in the processing liquid that faces a central side of the surface.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
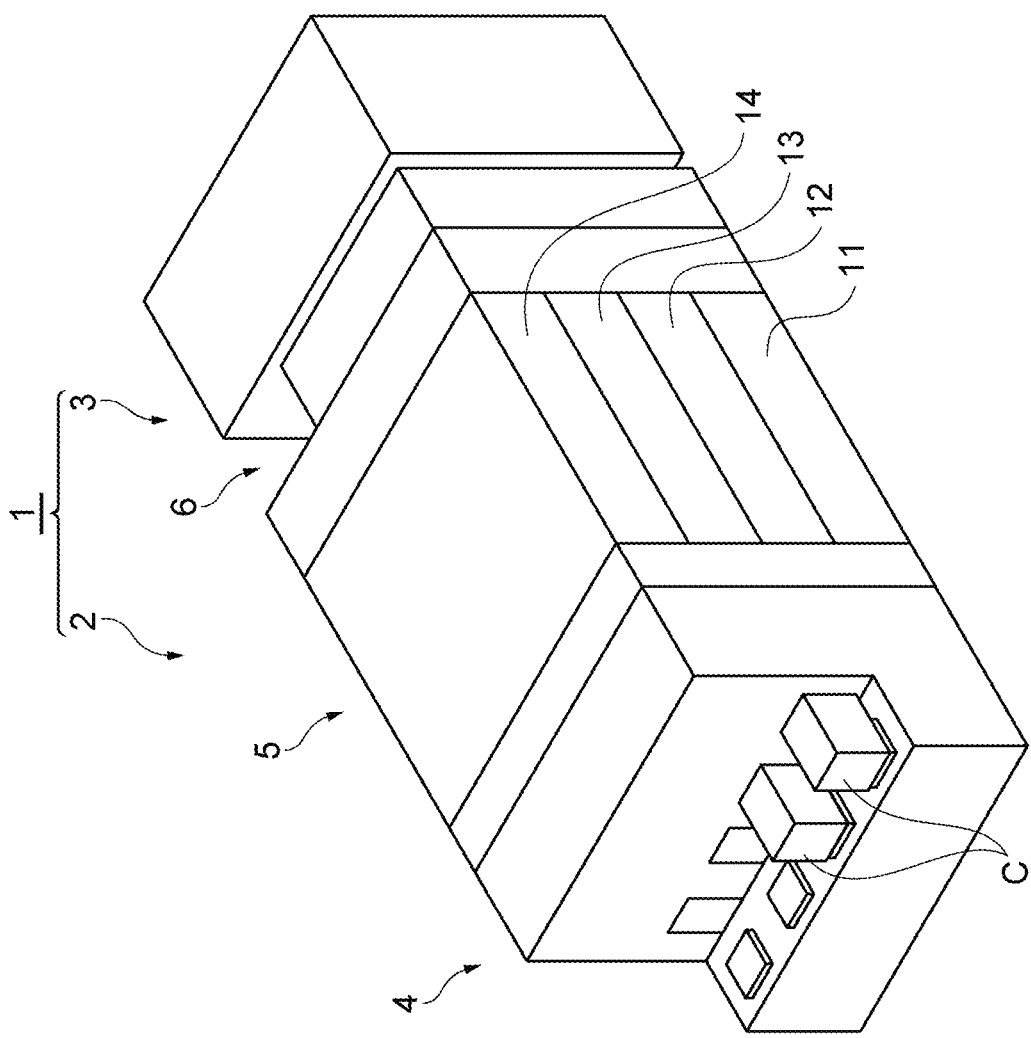
FIG. 1 is a perspective view illustrating an example of a substrate processing system.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

In an embodiment, a substrate processing method is provided. The substrate processing method relates to forming a processing film on a peripheral edge of a substrate surface. The method includes: supplying a processing liquid to a peripheral edge of a surface of a substrate to form the processing film on the peripheral edge of the surface of the substrate; and bringing a molding solvent supplied to an inner region than a region of the substrate surface to which the processing liquid is supplied into contact with an interface of the substrate that faces a central side of the surface.

According to the substrate processing method, it is possible to remove a hump formed when the processing liquid is supplied by a molding solvent by bringing the molding solvent supplied to an inner region than a region of the substrate surface to which the processing liquid is supplied into contact with an interface of the substrate that faces a central side of the surface. Therefore, the film thickness of the processing film formed by the processing liquid may be made uniform.

The molding solvent may have a lower volatility than the solvent contained in the processing liquid.

When the molding solvent has a lower volatility than the solvent contained in the processing liquid, the contact time between the processing liquid and the molding solvent may be made longer, and molding with the molding solvent may be promoted. Therefore, the film thickness of the processing film may be made more uniform.

The embodiment may further include supplying the molding solvent to the surface of the substrate before supplying the processing liquid.

By including supplying the molding solvent to the substrate surface before supplying the processing liquid, it is possible to supply the processing liquid after the molding solvent supplied to the substrate surface is volatilized to a certain extent. Therefore, the molding solvent may be brought into contact with the processing liquid while adjusting the amount of the molding solvent remaining on the substrate, and the film thickness of the processing film may be adjusted in more detail.

The embodiment may further include supplying the molding solvent while rotating the substrate in the supplying of the molding solvent, and reducing the rotation speed of the substrate after supplying the molding solvent and before supplying the processing liquid.

It is possible to adjust the amount of molding solvent that comes into contact with the processing liquid using the change in rotation speed by reducing the rotation speed of the substrate after supplying the molding solvent and before supplying the processing liquid.

An interval between the supply of the molding solvent and the supply of the processing liquid may be determined according to the volatility and supply amount of the molding solvent.

It is possible to adjust the amount of molding solvent that comes into contact with the processing liquid on the substrate by changing the interval between the supply of the molding solvent and the supply of the processing liquid. Therefore, it is possible to mold the processing film more accurately by the molding solvent by adjusting the interval between the supply of the molding solvent and the supply of the processing liquid according to the volatility and supply amount of the molding solvent.

The processing liquid may be in a mode in which a plurality of solvents having different boiling points is mixed.

When a plurality of solvents having different boiling points is mixed in the processing liquid, Benard convection occurs in the processing liquid supplied on the substrate, and the formation of a hump is suppressed. Therefore, the unevenness of the film thickness of the processing film is further suppressed.

The plurality of solvents having different boiling points may be mixed at substantially the same ratio.

When a plurality of solvents having different boiling points is mixed at substantially the same ratio, Benard convection is likely to occur, so that the formation of a hump is further suppressed.

In an embodiment, a substrate processing apparatus is provided. The substrate processing apparatus forms a processing film on a peripheral edge of a substrate surface. The apparatus includes: a substrate holder configured to rotatably hold the substrate; a processing liquid supply configured to supply a processing liquid for forming the processing film on the peripheral edge of the substrate held in the substrate holder; and a solvent supply configured to supply a molding solvent to an inner region than a region of the substrate surface to which the processing liquid is supplied.

According to the substrate processing apparatus, it is possible to remove the hump formed when the processing liquid is supplied by a molding solvent by bringing the molding solvent supplied to an inner region than a region of the substrate surface to which the processing liquid is supplied into contact with an interface of the substrate that faces a central side of the surface. Therefore, the film thickness of the processing film formed by the processing liquid may be made uniform.

The molding solvent supplied from the solvent supply may have a lower volatility than the solvent contained in the processing liquid supplied from the processing liquid supply.

When the molding solvent has a lower volatility than the solvent contained in the processing liquid, the contact time between the processing liquid and the molding solvent may be made longer, and molding with the molding solvent may be promoted. Therefore, the film thickness of the processing film may be made more uniform.

The substrate processing apparatus further includes a controller that controls the processing liquid supply and the solvent supply. The controller may be in a mode of controlling the interval between the supply of the molding solvent from the solvent supply and the supply of the processing liquid from the processing liquid supply according to the volatility and supply amount of the molding solvent.

It is possible to adjust the amount of molding solvent that comes into contact with the processing liquid on the substrate by changing the interval between the supply of the molding solvent and the supply of the processing liquid. Therefore, it is possible to mold the processing film more accurately by the molding solvent by adjusting the interval between the supply of the molding solvent and the supply of the processing liquid according to the volatility and supply amount of the molding solvent by the controller.

Various embodiments will now be described with reference to the accompanying drawings. In the following description, the same elements or elements having the same function are denoted by the same reference symbols, and redundant descriptions thereof are omitted.

Substrate Processing System

A substrate processing system 1 illustrated in FIG. 1 is a system that forms a photosensitive film, exposes the photosensitive film, and develops the photosensitive film on a workpiece W. The workpiece W to be processed is, for example, a substrate or a substrate in which a film and a circuit are formed by performing a predetermined process. The substrate included in the workpiece W is, for example, a wafer containing silicon. The workpiece W (substrate) may be formed in a circular shape. The workpiece W to be processed may be a glass substrate, a mask substrate, or a flat panel display (FPD), or may be an intermediate obtained by subjecting these substrates to a predetermined process. The photosensitive film is, for example, a resist film.

The substrate processing system 1 includes a coating/developing device 2, an exposure device 3, and a control device 100 (control unit). The exposure device 3 is a device for exposing a resist film (photosensitive film) formed on the workpiece W (substrate). Specifically, the exposure device 3 irradiates the exposed portion of the resist film with energy rays by a method such as an immersion exposure. The coating/developing device 2 applies a resist (processing liquid) to the surface of the workpiece W to form a resist film before the exposure process by the exposure device 3, and develops the resist film after the exposure process.

Substrate Processing Apparatus

Figure 2:
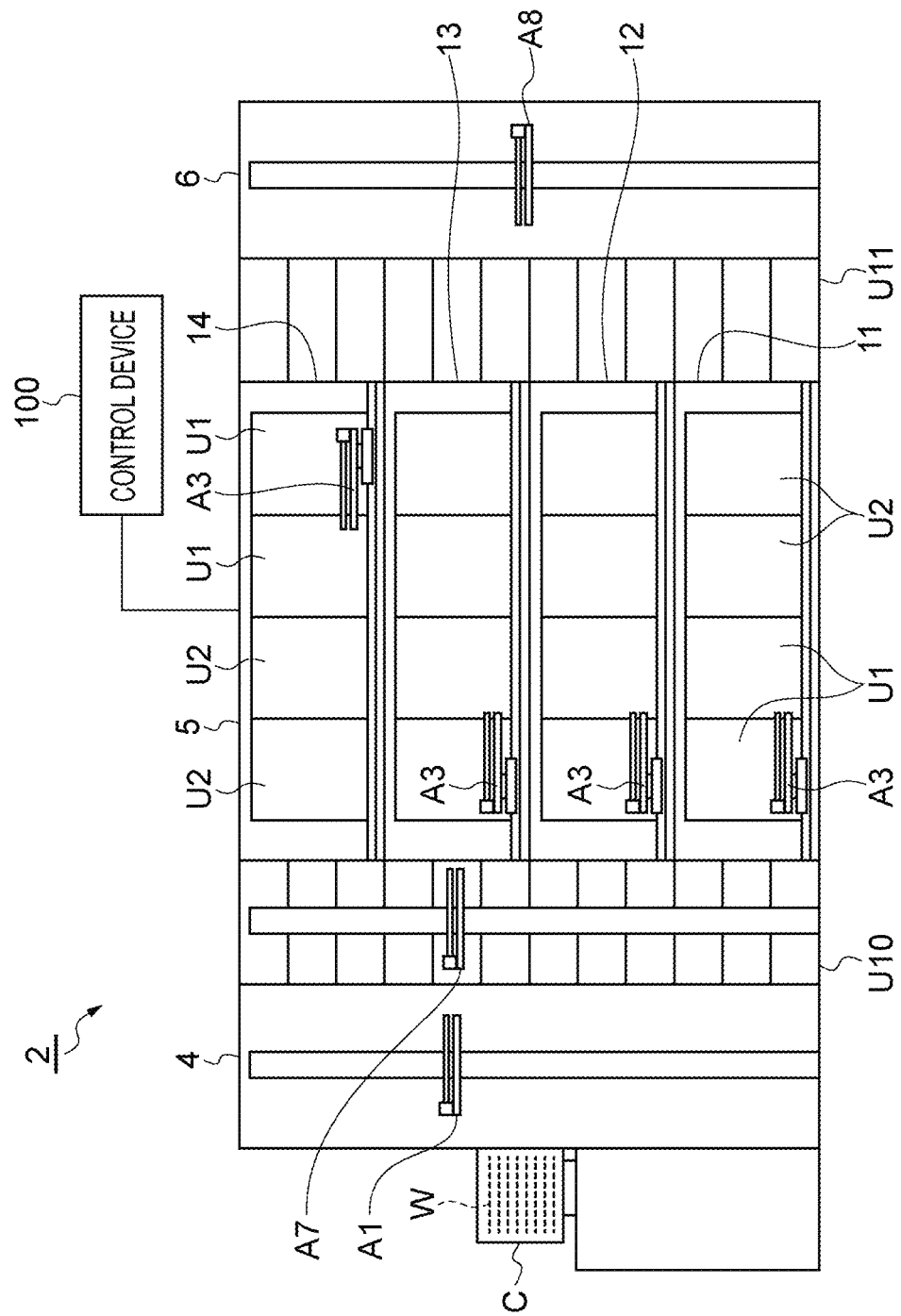
FIG. 2 is a side view schematically illustrating an example of the inside of the substrate processing system.

Hereinafter, the configuration of the coating/developing device 2 will be described as an example of the substrate processing apparatus. As illustrated in FIGS. 1 and 2, the coating/developing device 2 includes a carrier block 4, a processing block 5, and an interface block 6.

The carrier block 4 introduces the workpiece W into the coating/developing device 2 and derives the workpiece W from the coating/developing device 2. For example, the carrier block 4 may support a plurality of carriers C for the workpiece W, and incorporates a transfer device A1 including a delivery arm. Each of the carriers C accommodates, for example, a plurality of circular workpieces W. The transfer arm A1 takes out the wafer W from the carrier 11 to transfer the wafer W to the processing block 5, and receives the wafer W from the processing block 5 and returns the wafer W into the carrier 11. The processing block 5 has a plurality of processing modules 11, 12, 13, and 14.

The processing module 11 includes a coating unit U1, a heat processing unit U2, and a transfer device A3 that transfers the workpiece W to these units. The processing module 11 forms a lower layer film on the surface of the workpiece W by the coating unit U1 and the heat processing unit U2. The coating unit U1 coats the processing liquid for forming the lower layer film on the workpiece W. The heat processing unit U2 performs various heat processing accompanying the formation of the lower layer film.

The processing module 12 (liquid processing unit) includes a coating unit U1, a heat processing unit U2, and a transfer device A3 that transfers the workpiece W to these units. The processing module 12 performs a liquid processing including forming a resist film on the lower layer film by the coating unit U1 and the heat processing unit U2. The coating unit U1 coats a processing liquid (resist liquid) for forming a resist film on the lower layer film. The heat processing unit U2 performs various heat processing accompanying the formation of the film. Further, the coating unit U1 has a function of forming a protective film (processing film) with a resist liquid on the periphery of the workpiece W.

The processing module 13 incorporates a coating unit U1, a heat processing unit U2, and a transfer device A3 that transfers the workpiece W to these units. The processing module 13 forms an upper layer film on the resist film by the coating unit U1 and the heat processing unit U2. The coating unit U1 coats the liquid for forming the upper layer film on the resist film. The heat processing unit U2 performs various heat processing accompanying the formation of the upper layer film.

The processing module 14 incorporates a coating unit U1, a heat processing unit U2, and a transfer device A3 that transfers the workpiece W to these units. The processing module 14 uses the coating unit U1 and the heat processing unit U2 to develop the exposed resist film and heat-treat the resist film. The coating unit U1 develops a resist film by applying a developing solution on the surface of the exposed workpiece W and then rinsing the surface with a rinse liquid. The heat processing unit U2 performs various heat processing accompanying the developing process. Specific examples of the heat processing include a heat processing before development processing (PEB: post exposure bake) and a heat processing after development processing (PB: post bake).

A shelf unit U10 is provided on the carrier block 4 in the processing block 5. The shelf unit U10 is divided into a plurality of cells arranged in the vertical direction. A transfer device A7 including an elevating arm is provided in the vicinity of the shelf unit U10. The transfer device A7 moves the wafer W up and down between the cells of the shelf unit U10.

A shelf unit U11 is provided on the interface block 6 in the processing block 5. The shelf unit U11 is divided into a plurality of cells arranged in the vertical direction.

The interface block 6 transfers the workpiece W to and from the exposure device 3. For example, the interface block 6 has a built-in transfer device A8 including a transfer arm, and is connected to the exposure device 3. The transfer device A8 passes the workpiece W arranged on the shelf unit U11 to the exposure device 3. The transfer device A8 receives the workpiece W from the exposure device 3 and returns the workpiece W to the shelf unit U11.

Coating Unit

Figure 3:
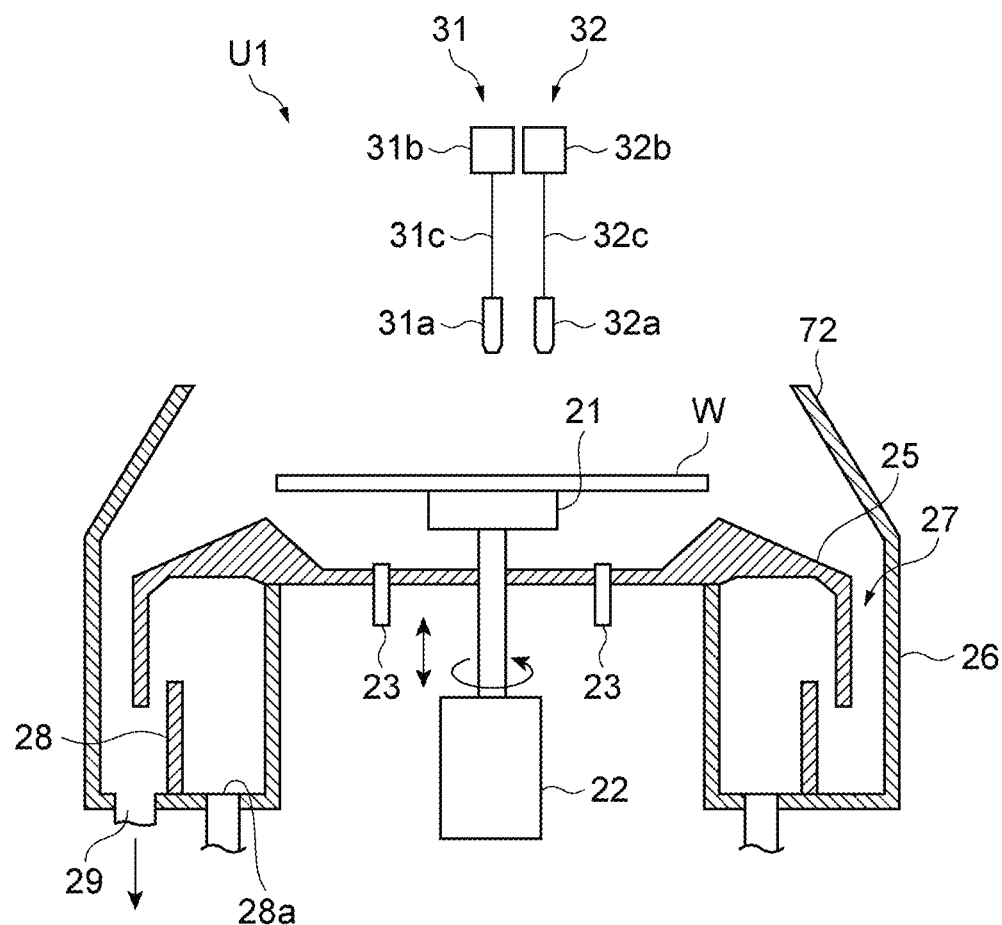
FIG. 3 is a schematic view illustrating an example of a coating unit.

Subsequently, the coating unit U1 of the processing module 12 will be described in detail. As illustrated in FIG. 3, the coating unit U1 of the processing module 12 includes a spin chuck 21 (substrate holder), a rotation driver 22, a support pin 23, a guide ring 25, a cup 26, an exhaust pipe 28, and a drain port 29. Further, the coating unit U1 includes a solvent supply 31 and a processing liquid supply 32. The solvent supply 31 and the processing liquid supply 32 have a function of supplying a processing liquid used when forming a protective film on the peripheral edge of the workpiece W.

The spin chuck 21 holds the wafer W horizontally. The spin chuck 21 is connected to the rotation driver 22 via a shaft extending in the vertical direction. The rotation driver 22 rotates the spin chuck 21 at a predetermined rotation speed based on the control signal output from the control device 100.

The support pins 23 may support the back surface of the workpiece W, and three supports pins 23 are provided around the shaft of the spin chuck 21 as an example. The support pins 23 may be moved up and down by an elevating mechanism (not illustrated). The workpiece W is delivered between the transfer mechanism (not illustrated) of the workpiece W and the spin chuck 21 by the support pin 23.

The guide ring 25 is provided below the workpiece W held by the spin chuck 21 and has a function of guiding the processing liquid supplied to the surface of the workpiece W toward the drain port. Further, a cup 26 for suppressing the scattering of the processing liquid is provided to surround the outer circumference of the guide ring 25. The upper portion of the cup 26 is open so that the workpiece W may be delivered to the spin chuck 21. A space 27 serving as a liquid ejection path is formed between the side peripheral surface of the cup 26 and the outer peripheral edge of the guide ring 25. Further, an exhaust pipe 28 having an exhaust port 28a and a drainage port 29 for ejecting the liquid moving in the space 27 are provided below the cup 26.

The coating unit U1 is provided with two processing liquid supplies for supplying two types of processing liquids. The solvent supply 31 ejects a solvent (molding solvent) from above the workpiece W supported by the spin chuck 21 toward the center of the surface of the workpiece W. Further, the processing liquid supply 32 ejects a processing liquid from above the workpiece W supported by the spin chuck 21 toward the peripheral edge of the surface of the workpiece W.

The solvent supply 31 includes a nozzle 31a, a solvent supply source 31b, and a pipe 31c. Further, the processing liquid supply 32 includes a nozzle 32a, a processing liquid supply source 32b, and a pipe 32c. An on/off valve controlled by the control device 100 may be provided on each of the pipes of the solvent supply 31 and the processing liquid supply 32. The supply/stop of the processing liquid may be switched by switching between the open state and the closed state of the on/off valve based on the control signal from the control device 100.

Examples of the solvent supplied from the solvent supply 31 include a solvent (e.g., thinner) capable of dissolving the processing liquid (processing liquid for forming a protective film) supplied from the processing liquid supply 32. The solvent supplied from the solvent supply 31 is required to have a property of dissolving the processing liquid for forming the protective film supplied from the processing liquid supply 32. Further, the solvent supplied from the solvent supply 31 is required to have a property of not dissolving the resist pattern already formed on the surface of the workpiece W. Under such conditions, the type of solvent may be selected depending on the processing liquid for forming the protective film supplied from the processing liquid supply 32 and the material of the pattern formed on the workpiece W.

Examples of the processing liquid supplied from the processing liquid supply 32 include a processing liquid (e.g., a resist liquid) used when forming a protective film on the peripheral edge of the workpiece W. In the following description, the processing liquid supplied from the solvent supply 31 may be referred to as solvent R1, and the processing liquid supplied from the processing liquid supply 32 (processing liquid for forming a protective film) may be referred to as processing liquid R2.

When a specific processing liquid used in the present embodiment is "dissolved" in a specific solvent, it does not mean that when a specific solvent is mixed with the specific processing liquid, each solid component constituting the processing liquid dissolves in the solvent. That is, the fact that each of the solid components constituting the processing liquid is movable is called "dissolving." Specifically, in a state where the specific processing liquid adheres to, for example, the workpiece W and does not move, the solid components (e.g., resin particles in the case of a resist liquid) constituting the processing liquid are in a state of being close to each other. When a specific solvent is mixed with the processing liquid in this state, the solvent enters between the solid components constituting the processing liquid. As a result, each solid component in the processing liquid may move (flow), and the processing liquid is removed from the region to which the processing liquid has adhered. The term "dissolve" in the present embodiment means a state in which each solid component constituting the processing liquid is movable as described above, and as a result, the processing liquid may be removed.

The nozzle 31a of the solvent supply 31 and the nozzle 32a of the processing liquid supply 32 are attached to, for example, an arm extending in the horizontal direction and are movable in the horizontal direction. Further, the nozzles 31a and 32a are also movable in the vertical direction. That is, although not illustrated in FIG. 3, the coating unit U1 is provided with a moving mechanism for moving the nozzles 31a and 32a in the horizontal direction and the vertical direction. Then, by the operation of the moving mechanism, the nozzles 31a and 32a may move between the standby position outside the cup 26 and the workpiece W.

Among the nozzles 31a and 32a, particularly, as for the nozzle 32a, a nozzle having a processing liquid ejection port having a small diameter to a certain extent (e.g., the diameter of the ejection port is about 1 mm or less) may be used. When a nozzle having a small diameter is used, the processing liquid may be appropriately supplied to a specific position on the workpiece W by moving the position of the nozzle in the vertical direction and the horizontal direction. However, the diameters of the nozzles 31a and 32a are not limited to the example described above. Further, the shapes of the nozzles 31a and 32a are not particularly limited.

The control device 100 controls the coating/developing device 2. The control device 100 executes a liquid processing on the workpiece W by the processing module 12 according to a predetermined condition. The control device 100 supplies the solvent/processing liquid to the workpiece W by the solvent supply 31 and the processing liquid supply 32 based on, for example, predetermined conditions, and controls the rotation of the workpiece W at that time. The control device 100 may be constituted by a plurality of functional modules for executing the liquid processing. Each functional module is not limited to the one implemented by the execution of a program, but may be implemented by a dedicated electric circuit (e.g., a logic circuit) or an integrated circuit (ASIC: application specific integrated circuit) in which the circuit is integrated.

Figure 4:
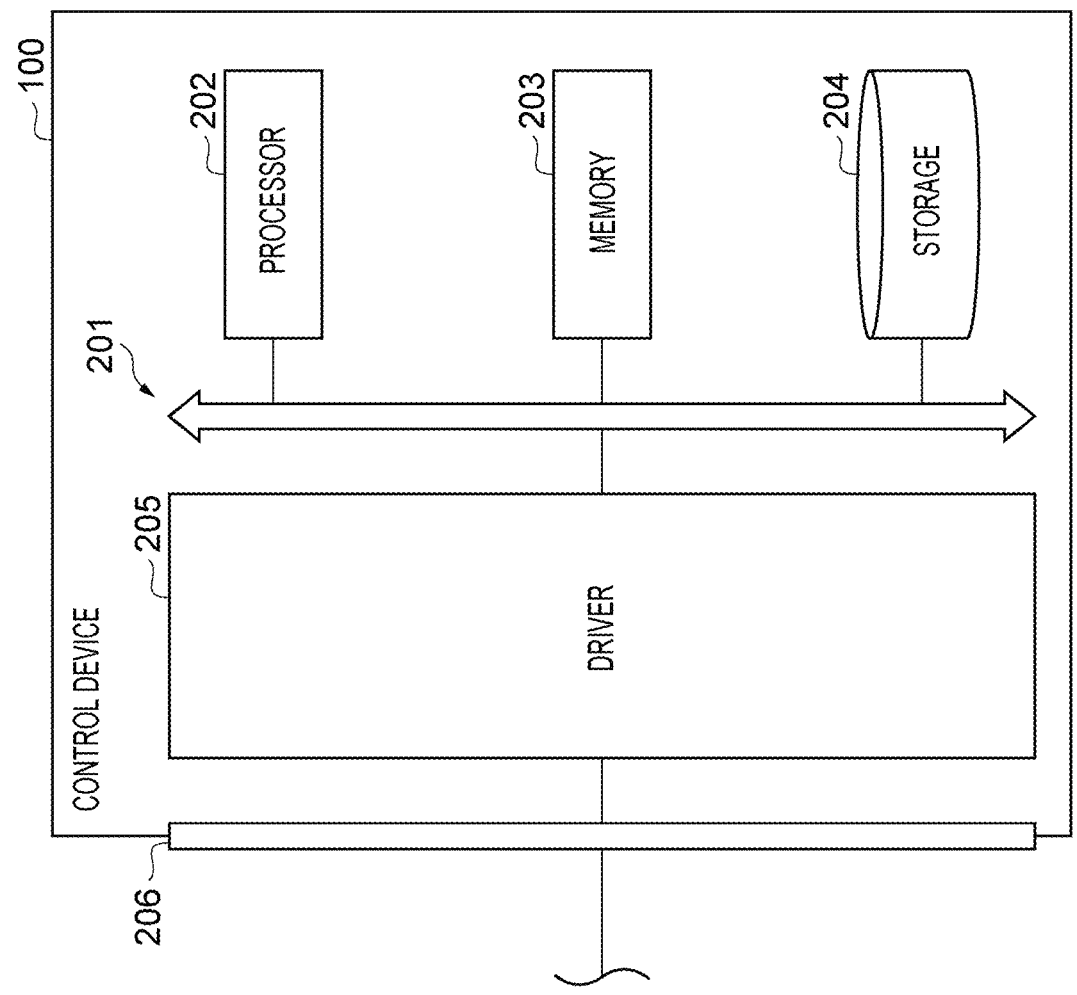
FIG. 4 is a block diagram illustrating an example of a hardware configuration of a control device.

The hardware of the control device 100 may be constituted by, for example, one or a plurality of control computers. As illustrated in FIG. 4, the control device 100 includes a circuit 201 as a hardware configuration. The circuit 201 may be constituted by an electrical circuitry. The circuit 201 may include a processor 202, a memory 203, a storage 204, a driver 205, and an input/output port 206.

The processor 202 constitutes each of the above-mentioned functional modules by executing a program in cooperation with at least one of the memory 203 and the storage 204 and executing the input/output of a signal via the input/output port 206. The memory 203 and the storage 204 store various information and programs used by the control device 100. The driver 205 is a circuit that drives various apparatuses of the coating/developing device 2. The input/output port 206 inputs/outputs a signal between the driver 205 and each part constituting the coating/developing device 2.

The substrate processing system 1 may include a single control device 100, or may include a controller group (controllers) including a plurality of control devices 100. When the substrate processing system 1 includes the controller group, each of the plurality of functional modules may be implemented by, for example, one different control device, or may be implemented by a combination of two or more control devices 100. When the control device 100 is constituted by a plurality of computers (circuit 201), each of the plurality of functional modules may be implemented by a single computer (circuit 201). Further, the control device 100 may be implemented by a combination of two or more computers (circuit 201). The controller device 100 may have a plurality of processors 202. In this case, each of the plurality of functional modules may be implemented by a single processor 202, or may be implemented by a combination of two or more processors 202. A part of the functions of the control device 100 of the substrate processing system 1 may be provided in a device different from the substrate processing system 1 and connected to the substrate processing system 1 via a network to implement various operations in the present embodiment. For example, when the functions of the processor 202, the memory 203, and the storage 204 of the plurality of substrate processing systems 1 are collectively implemented by one or a plurality of separate devices, it becomes also possible to remotely collectively manage and control the information and operations of a plurality of substrate processing systems 1.

Subsequently, the processing of the workpiece W executed in the substrate processing system 1 will be described. The control device 100 controls the coating/developing device 2 to execute the process for the workpiece W in, for example, the following procedure. First, the control device 100 controls the transfer device A1 to transfer the workpiece W in the carrier C to the shelf unit U10, and controls the transfer device A7 to arrange the workpiece W in the cell for the processing module 11.

Next, the control device 100 controls the transfer device A3 to transfer the workpiece W of the shelf unit U10 to the coating unit U1 and the heat processing unit U2 in the processing module 11. Further, the control device 100 controls the coating unit U1 and the heat processing unit U2 to form a lower layer film on the surface of the workpiece W. Thereafter, the control device 100 controls the transfer device A3 so as to return the workpiece W on which the lower layer film is formed to the shelf unit U10, and controls the transfer device A7 so as to arrange the workpiece W in the processing module 12.

Next, the control device 100 controls the transfer device A3 to transfer the workpiece W of the shelf unit U10 to the coating unit U1 and the heat processing unit U2 in the processing module 12. The control device 100 controls the coating unit U1 and the heat processing unit U2 to form a resist film on the lower layer film of the workpiece W. An example of the liquid processing method performed in the processing module 12 will be described later. Thereafter, the control device 100 controls the transfer device A3 so as to return the workpiece W to the shelf unit U10, and controls the transfer device A7 so as to arrange the workpiece W in the cell for the processing module 13.

Next, the control device 100 controls the transfer device A3 to transfer the workpiece W of the shelf unit U10 to the coating unit U1 and the heat processing unit U2 in the processing module 13. Further, the control device 100 controls the coating unit U1 and the heat processing unit U2 to form an upper layer film on the resist film of the workpiece W. Thereafter, the control device 100 controls the transfer device A3 to transfer the workpiece W to the shelf unit U11.

Next, the control device 100 controls the transfer device A8 to send the workpiece W accommodated in the shelf unit U11 to the exposure device 3. Then, in the exposure device 3, the resist film formed on the workpiece W is exposed. Thereafter, the control device 100 receives the exposed workpiece W from the exposure device 3 and controls the transfer device A8 to arrange the workpiece W in the cell for the processing module 14 in the shelf unit U11.

Next, the control device 100 controls the transfer device A3 to transfer the workpiece W of the shelf unit U11 to the heat processing unit U2 of the processing module 14. Then, the control device 100 controls the coating unit U1 and the heat processing unit U2 to execute the developing process, and the heat processing associated with the developing processing. As described above, the control device 100 ends the substrate processing for a single workpiece W.

Substrate Processing Method

Next, an example of the substrate processing method performed in the processing module 12 will be described. Here, as a liquid processing method, a method of forming a protective film with a resist film on the peripheral edge W1 (see, e.g., FIGS. 6C and 6D) of the surface of the workpiece W will be described. The protective film formed on the peripheral edge W1 of the workpiece W is provided to protect a region on the surface of the workpiece W different from the central portion where the resist pattern is formed. Further, in the processing module 12, a process of forming a protective film is performed on the surface of the workpiece W in addition to the peripheral edge W1, but the description of forming the protective film on the region in addition to the peripheral edge W1 will be omitted.

Figure 5:
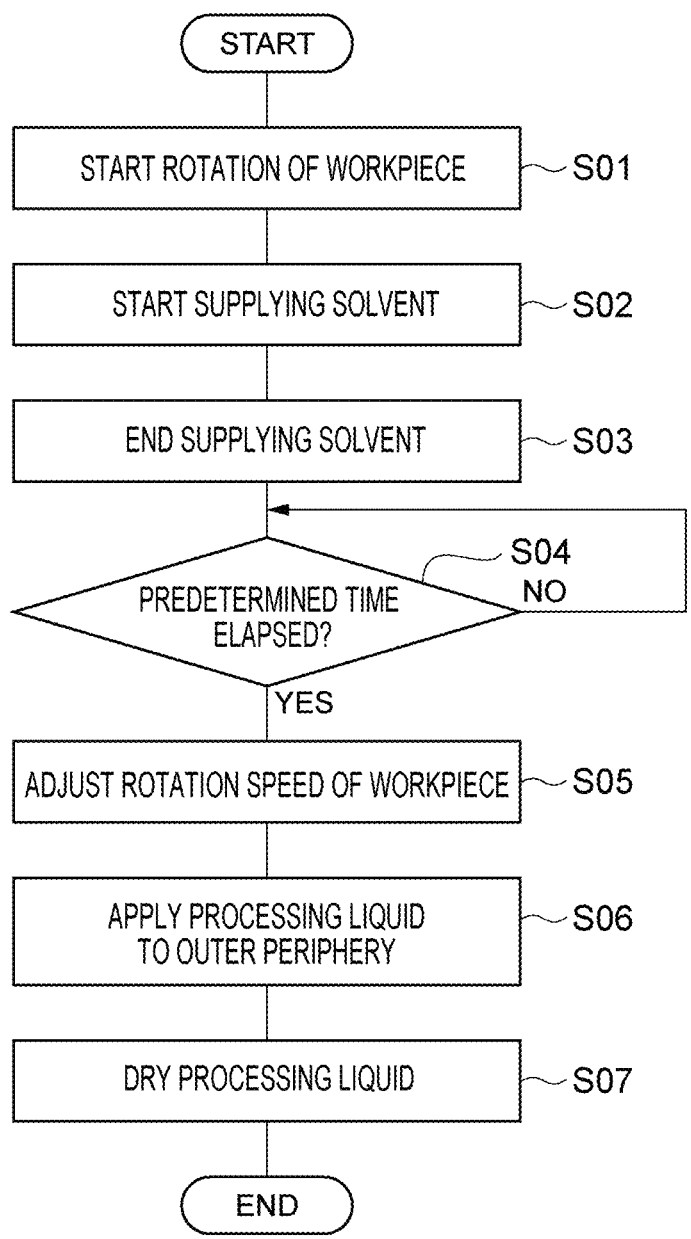
FIG. 5 is a flowchart illustrating an example of a substrate processing method.

FIG. 5 is a flowchart illustrating an example of a processing procedure for forming a protective film with the processing liquid R2 on the peripheral edge W1 of the surface of the workpiece W. Further, FIGS. 6A to 6E are views illustrating the situation of the peripheral edge W1 of the workpiece W and its vicinity in each procedure illustrated in FIG. 5. In FIGS. 6A to 6E, only a part of the cross section of the workpiece W (around the peripheral edge) may be illustrated.

As illustrated in FIG. 5, the control device 100 executes step S01. In step S01, the control device 100 controls the transfer device A3 and the support pin 23 of the coating unit U1 to support the workpiece W on the spin chuck 21 in the coating unit U1. Thereafter, the control device 100 starts the rotation of the workpiece W by driving the rotation driver 22. As an example, the rotation speed of the workpiece W at this time is about 100 rpm to 2,000 rpm.

Figure 6A:
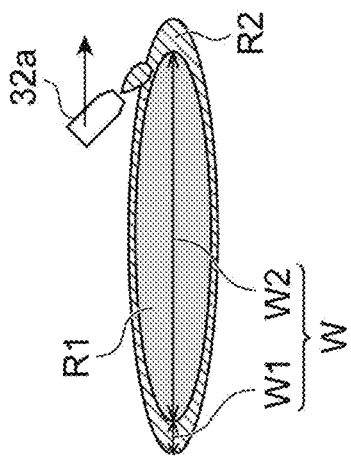
FIGS. 6A to 6E are schematic views illustrating an example of the substrate processing method.

Next, the control device 100 executes step S02. In step S02, the control device 100 controls the solvent supply 31 in a state where the workpiece W is rotated by driving the rotation driver 22, and ejects the solvent from the nozzle 31a toward the center of the surface of the workpiece W. The solvent supplied to the center of the surface of the workpiece W spreads in the radial direction of the workpiece W due to the rotation of the workpiece W. As a result, as illustrated in FIG. 6A, the solvent R1 adheres to the surface of the workpiece W. Thereafter, the control device 100 executes step S03. In step S03, the control device 100 controls the solvent supply 31 and stops the ejection of the solvent from the nozzle 31a. The timing at which the solvent ejection is stopped may be the timing at which a predetermined amount of solvent is ejected from the nozzle 31a. The amount of the solvent supplied to the workpiece W (i.e., the amount ejected from the nozzle 31a) may be, for example, such that the solvent sufficiently and evenly spreads on the surface of the workpiece W, but may be set to a condition suitable for forming the protective film described later.

Next, the control device 100 executes step S04. In step S04, the control device 100 waits in a state where the workpiece W is rotated until a predetermined time elapses. The predetermined time may be set based on the amount of solvent remaining on the peripheral edge of the workpiece W. This point will be described later. The state where the workpiece W is rotated is continued until the predetermined time elapses ("NO" in S04).

After the predetermined time has elapsed ("YES" in S04), the control device 100 executes step S05. In step S05, the control device 100 adjusts the rotation speed of the workpiece W by driving the rotation driver 22. The rotation speed of the workpiece W may be adjusted to control the movement of the solvent in the outer peripheral direction. When adjusting the rotation speed, as an example, a control (pullback) is taken in which the rotation speed is reduced in order to temporarily suppress the moving speed of the solvent in the outer peripheral direction. However, the adjustment of the rotation speed is not limited to the above. In the case of supplying the processing liquid in the subsequent stage, the original rotation speed (rotation speed set in step S01) may be returned. This step S05 does not have to be performed.

Figure 6B:
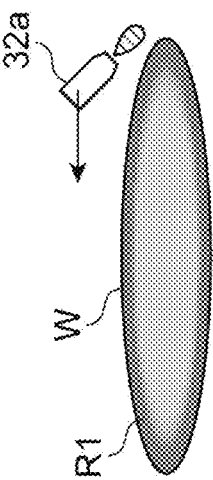
Figure 6C:
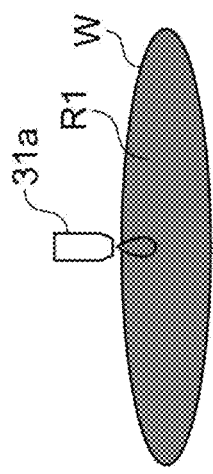

Next, the control device 100 executes step S06. In step S06, the control device 100 controls the processing liquid supply 32 in a state where the workpiece W is rotated by driving the rotation driver 22, and ejects the processing liquid from the nozzle 32a toward the peripheral edge of the workpiece W. At this time, as illustrated in FIG. 6B, the nozzle 32a is first moved in the horizontal direction from the outside in the radial direction of the workpiece W toward the center (scan-in step). Then, as illustrated in FIG. 6C, the nozzle 32a is moved horizontally to move outward in the radial direction from the center of the workpiece W (scan-out step). While the nozzle 32a is moved in the horizontal direction, the rotation of the workpiece W and the supply of the processing liquid from the nozzle 32a are continued. As a result, the processing liquid R2 is supplied to the peripheral edge of the workpiece W.

Next, the control device 100 executes step S07. In step S07, the control device 100 dries the surface of the workpiece W. As an example, the control device 100 may include a method of shaking off the solvent R1 remaining on the surface of the workpiece W to the outside of the workpiece W by driving the rotation driver 22 and rotating the workpiece W. Further, by continuing the rotation of the workpiece W, the volatilization (drying) of the solvent R1 is promoted, and further, the processing liquid R2 is dried to form the protective film R. As a result, the solvent R1 is removed from the surface of the workpiece W, and a protective film R formed by the processing liquid R2 is formed on the peripheral edge W1 of the surface of the workpiece W.

Figure 6D:
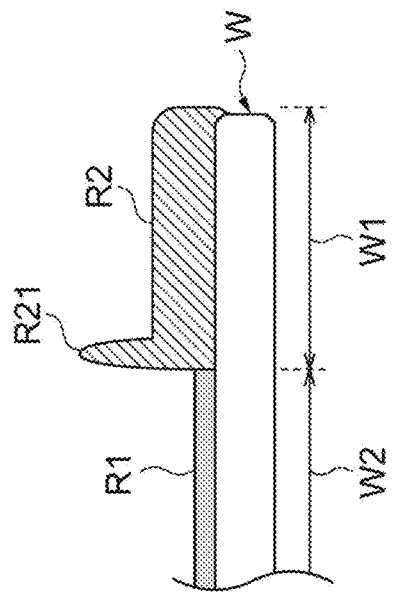

In the series of processes, when the processing liquid R2 and the solvent R1 contact with each other, the shape of the protective film R changes. FIG. 6D is an enlarged view of the vicinity of the peripheral edge of the workpiece W when the processing liquid R2 is supplied to the peripheral edge of the workpiece W. As illustrated in FIG. 6D, the processing liquid R2 is applied in a ring shape along the peripheral edge W1 of the workpiece W. A hump R21 may be formed in the inner periphery of the processing liquid R2 coated in a ring shape through the scan-in step and the scan-out step as described above. The hump R21 is a region (projection) that is extremely raised with respect to another region, and may be formed in a ring shape in the inner periphery of the processing liquid R2. It is considered that the hump R21 is formed by Marangoni convection in the processing liquid R2 applied to the surface of the workpiece W.

Figure 7A:
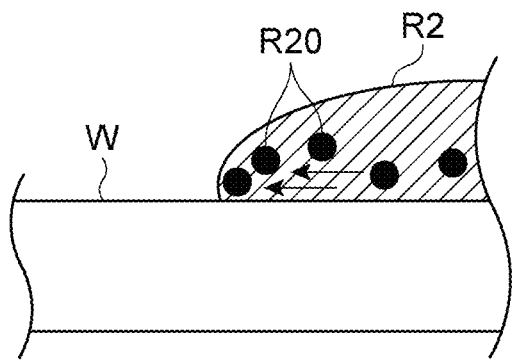
FIGS. 7A and 7B are schematic views illustrating an example of a method of forming a hump by Marangoni convection.
Figure 7B:
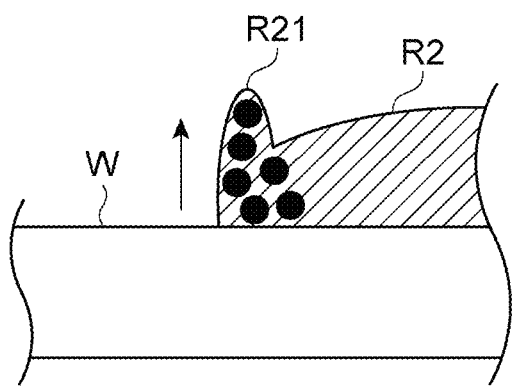

Marangoni convection is a flow that occurs in the processing liquid R2 that stays on the surface of the workpiece W, and when the processing liquid R2 volatilizes, the processing liquid moves in the lateral direction (horizontal direction) toward the contour portion of the processing liquid R2. FIGS. 7A and 7B schematically illustrate an example of how a hump is formed by the Marangoni convection generated at the peripheral edge of the processing liquid R2. As illustrated in FIG. 7A, when Marangoni convection occurs in the processing liquid R2 on the workpiece W, the solid component R20 (e.g., resin particles in the case of a resist liquid) constituting the processing liquid moves to the contour portion of the processing liquid R2 on the convection. The contour portion of the processing liquid R2 is the end portion of the inner periphery of the processing liquid R2. As a result of the solid components R20 in the processing liquid being concentrated and deposited on the inner periphery, as illustrated in FIG. 7B, a hump R21 having a thickness larger than that of other regions may be formed. When the processing liquid R2 is dried to become the protective film R as it is, the protective film R is formed with the hump R21 remaining.

Meanwhile, the solvent R1 ejected to the surface of the workpiece W is present at this stage. The solvent R1 is present in the region (the inner region W2 illustrated in FIGS. 6C and 6D) further inside the processing liquid R2 supplied to the surface of the workpiece W. Therefore, as illustrated in FIG. 6D, the processing liquid R2 supplied to the peripheral edge W1 and the solvent R1 remaining in the inner region W2 contact with each other at the interface.

Figure 6E:
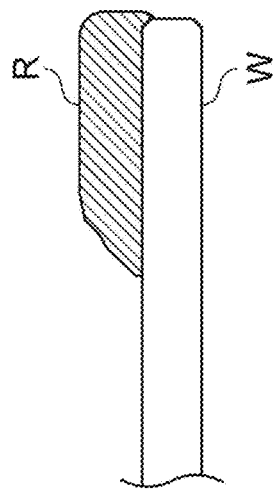

At this time, since the solvent R1 has a property of dissolving the processing liquid R2 (protective film R), when the solvent R1 moves to the outside of the workpiece W due to the centrifugal force of the rotation of the workpiece W, it moves while dissolving a part of the processing liquid R2. As a result, since a part of the processing liquid R2 scatters to the outside of the workpiece W together with the solvent R1, the protective film R is formed in a state where a part of the processing liquid R2 is removed together with the solvent R1, as illustrated in FIG. 6E. At this time, the processing liquid R2 existing in the region corresponding to the hump R21 is also moved to the outside of the workpiece W as the solvent R1 moves. Therefore, after the solvent R1 has moved, it is possible to reduce the region having a height (thickness) protruding from the other regions of the protective film R, like the hump R21. That is, the processing liquid R2 may adjust the shape of the protective film R so that the surface shape of the protective film R becomes smooth.

When the amount of the solvent R1 remaining on the workpiece W at the time of supplying the processing liquid R2 onto the workpiece W is large, with the movement of the solvent R1, the processing liquid R2 may be removed to the extent that the protective film R cannot be formed appropriately. Meanwhile, when the amount of the solvent R1 remaining on the workpiece W at the time of supplying the processing liquid R2 onto the workpiece W is small, the processing liquid R2 may not be appropriately removed by the solvent R1 and the protective film R may be formed with the hump R21 remaining. Therefore, it is required to control the contact between the solvent R1 and the processing liquid R2 so that the protective film R is appropriately formed while suppressing the hump R21 from remaining. Factors for adjusting the residual amount of the solvent R1 at the time of supplying the processing liquid R2 onto the workpiece W include the amount of the solvent R1 supplied onto the workpiece W, the waiting time from the supply of the solvent R1 to the supply of the processing liquid R2, and the rotation speed of the workpiece W. By appropriately adjusting these elements according to the characteristics of the solvent R1 (e.g., viscosity), the characteristics of the processing liquid R2 (e.g., viscosity, density), and the size (width/height) of the protective film R, the protective film R may be formed more uniformly. The control device 100 may adjust the waiting time and the rotation speed of the workpiece W according to the types of the solvent R1 and the processing liquid R2 and the supply amount of the solvent R1.

Further, when a highly volatile solvent is used as the solvent R1, it is considered that the solvent R1 is volatilized before it spreads to the region where the processing liquid R2 is supplied. Therefore, it is conceivable to use a solvent having a relatively low volatility as the solvent R1. For example, the processing liquid R2 is a chemical in which each solid component is dispersed in the solvent, and a solvent having a lower volatility than the solvent in the processing liquid R2 may be used as the solvent R1. In such a solvent combination, the solvent R1 (molding solvent) may be, for example, an organic solvent having a relatively low boiling point of about 100° C. to 150° C., and specific examples thereof include isopropyl or ethyl acetate, 1,1,1-trichloroethane, 2-methoxy-1-methylethyl acetate, 1,2-dichloroethylene, isopropyl acetate, and 1-methoxy-2-propanol. Further, the solvent in the processing liquid R2 may be, for example, an organic solvent having a relatively high boiling point of about 180° C. to 270° C., and specific examples thereof include chlorobenzene, styrene, trichloroethylene, toluene, isobutyl alcohol, dipropylene glycol, and 2-butanol. Even when the solvent R1 is highly volatile, it is also possible to supply the processing liquid R2 in the presence of the solvent R1 and bring the solvent R1 and the processing liquid R2 into contact with each other by adjusting the supply amount.

By the processing, the protective film R illustrated in FIG. 6E is formed on the peripheral edge of the workpiece W. Further, in FIG. 5, only the supply of the processing liquid and the solvent to the workpiece W has been described, but for the purpose of fixing the processing liquid or promoting a removal process with the solvent, a heat processing and a drying processing may be performed during each step. When performing the heat processing, for example, the workpiece W may be moved to the heat processing unit U2 to perform the heat processing.

Changes in Protective Film Shape Due to Differences in Processing Procedures

The fact that the supply amount of the solvent R1 affects the shape of the protective film R will be described with reference to the evaluation results illustrated in FIGS. 8A to 8D and 9A to 9D. Here, the evaluation results will be described using four evaluation examples in which the waiting times from the supply of the solvent R1 to the supply of the processing liquid R2 are different from each other.

Evaluation Example 1

In Evaluation Example 1, a protective film was formed on the region based on the procedure illustrated in FIG. 5 taking a range of 6 mm from the peripheral edge of the workpiece W having a diameter of 300 mm as the peripheral edge W1. However, the rotation speed after supplying the solvent R1 illustrated in step S05 was not adjusted. By using thinner as the solvent R1, thinner was supplied while rotating the workpiece W at a rotation speed of 1500 rpm. Then, after 5 seconds had elapsed as the waiting time, the processing liquid R2 was supplied, and the solvent R1 and the processing liquid R2 were dried to form the protective film R while maintaining the rotation speed. The workpiece W according to Evaluation Example 1 was obtained by the procedure.

Evaluation Examples 2 to 4

As Evaluation Examples 2 to 4, the workpieces W according to Evaluation Examples 2 to 4 were obtained by the same procedure as in Evaluation Example 1 except that the waiting times were set to 6 seconds, 7 seconds, and 9 seconds, respectively.

Evaluation of Interface

For each workpiece W of Evaluation Examples 1 to 4, the boundary in the inner periphery of the protective film R was captured. Further, the film thickness of the protective film R was estimated based on a correlation between the shading information of the image obtained from the capturing result and the film thickness of the protective film R. The results are illustrated in FIGS. 8A to 8D and 9A to 9D.

Figure 8C:
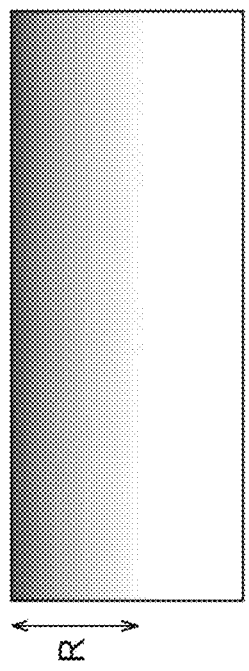
FIGS. 8A to 8D are views illustrating an example of evaluation results of the workpieces according to Evaluation Examples 1 and 2.
Figure 8D:
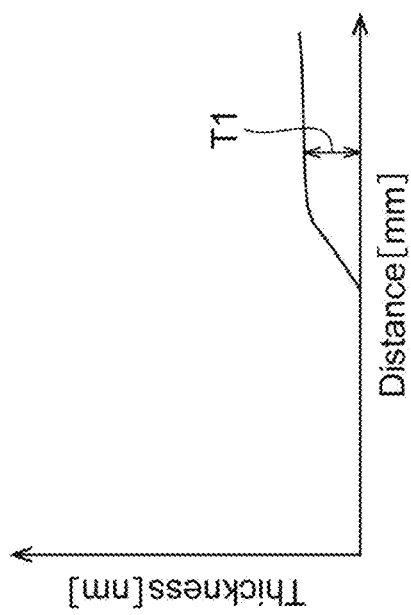
Figure 8A:
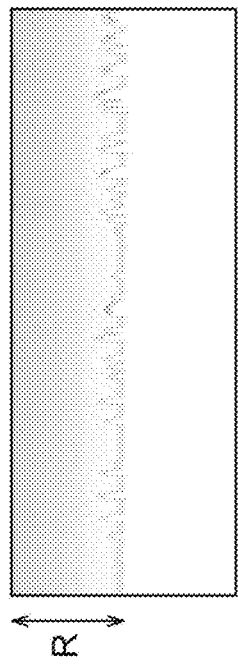
Figure 8B:
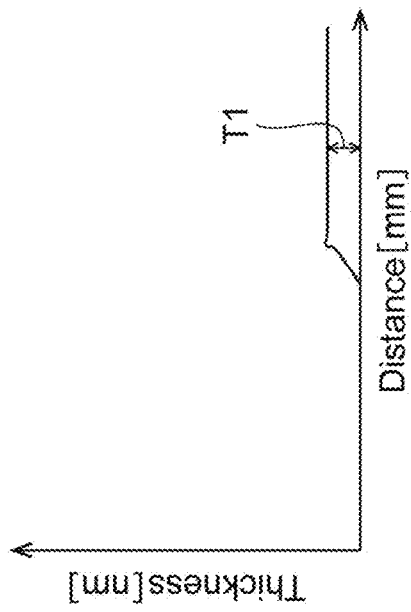
Figure 9A:
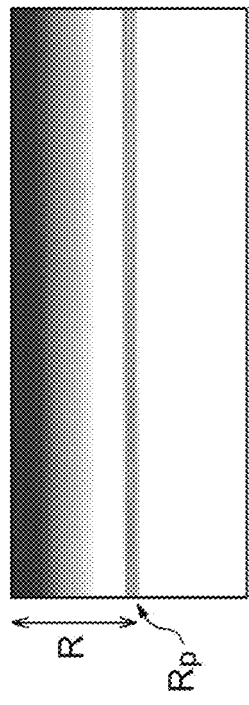
FIGS. 9A to 9D are views illustrating an example of evaluation results of the workpieces according to Evaluation Examples 3 and 4.
Figure 9B:
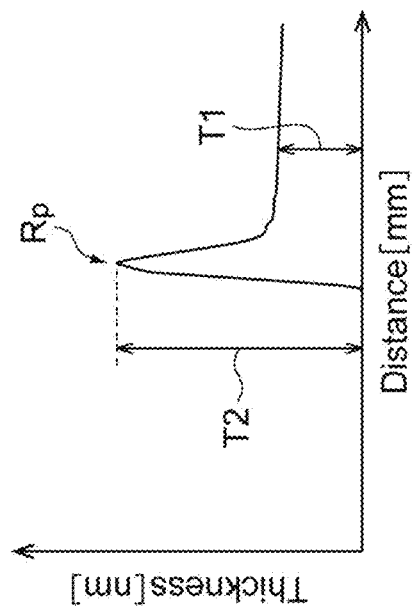
Figure 9C:
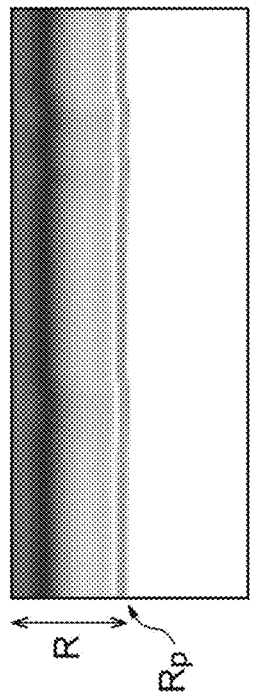
Figure 9D:
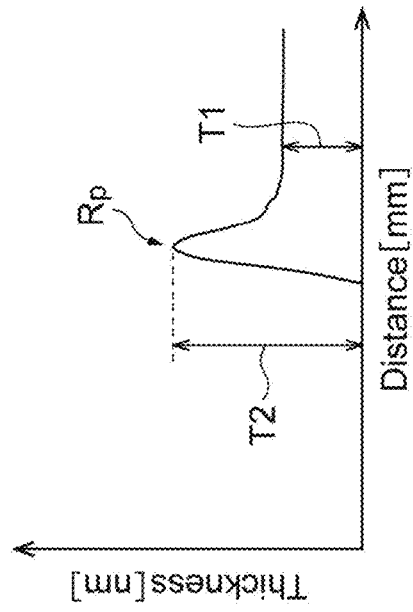

FIGS. 8A and 8B are examples of the results according to Evaluation Example 1, FIGS. 8C and 8D are examples of the results according to Evaluation Example 2, FIG. 9A and FIG. 9B are examples of the results according to Evaluation Example 3, and FIGS. 9C and 9D are examples of the results according to Evaluation Example 4. Further, FIGS. 8A, 8C, 9A, and 9C illustrate an example of the result of capturing the vicinity of the protective film R. In each of the figures, the upper end of the image is a part of the end portion and the side surface of the workpiece W, and the lower end of the image is the center of the workpiece W. Further, a region in which the protective film R is captured is represented above the image. FIGS. 8B, 8D, 9B, and 9D schematically illustrate the film thickness of the protective film R. The horizontal axis (distance) in each figure is the distance from the center, and as the horizontal axis increases, it moves toward the peripheral edge.

In Evaluation Example 1, as illustrated in FIG. 8A, it was confirmed that the interface of the protective film R (the interface with the surface of the workpiece W) was slightly loose. Further, the change in the film thickness of the protective film R at the interface was not considered to be smooth as illustrated in FIG. 8B. It was confirmed that the film thickness T1 of the protective film R was about 35% thinner than that in the case where the solvent R1 was not supplied. From this point, it is presumed that when the solvent R1 was scattered outward, a part of the processing liquid R2 was totally removed. When the waiting time was shorter than that of Evaluation Example 1, the processing liquid R2 did not remain and the protective film R was not formed.

In Evaluation Example 2, as illustrated in FIG. 8C, it was confirmed that the interface of the protective film R (the interface with the surface of the workpiece W) was smooth. Further, the change in the film thickness of the protective film R at the interface was smooth as illustrated in FIG. 8D. It was confirmed that the film thickness T1 of the protective film R was about 30% thinner than that in the case where the solvent R1 was not supplied. Compared with Evaluation Example 1, it is presumed that the amount of the processing liquid R2 removed when the solvent R1 was scattered to the outside became smaller.

In Evaluation Example 3, as illustrated in FIG. 9A, it was confirmed that a protrusion Rp derived from the hump remained at the interface of the protective film R (the interface with the surface of the workpiece W). Further, the change in the film thickness of the protective film R at the interface was such that the portion of he protrusion Rp projected as illustrated in FIG. 9B. The film thickness T1 of the protective film R was equivalent to that in the case where the solvent R1 was not supplied, but it was confirmed that the film thickness T2 (height) of the protrusion Rp was about 19% thinner than that of the protrusion formed when the solvent R1 was not supplied. From this point, it is presumed that although a part of the hump was removed by the solvent R1, it was not able to be sufficiently removed.

In Evaluation Example 4, as illustrated in FIG. 9C, it was confirmed that the protrusion Rp derived from the hump remained at the interface of the protective film R (the interface with the surface of the workpiece W). Further, the change in the film thickness of the protective film R at the interface was such that the protrusion Rp projected as illustrated in FIG. 9D. The film thickness T1 of the protective film R was equivalent to that in the case where the solvent R1 was not supplied, but the film thickness T2 (height) of the protrusion Rp was also equivalent to that in the case where the solvent R1 was not supplied. From this point, it was confirmed that when the waiting time after supplying the solvent R1 is lengthened, the effect of forming the protective film R by the solvent R1 was not obtained.

It was confirmed that the effect of forming the protective film R by the solvent R1 (particularly, the removal of protrusions derived from the hump) was changed by changing the waiting time as in Evaluation Examples 1 to 4. Therefore, the protective film R having an adjusted surface shape may be obtained by appropriately adjusting the waiting time after supplying the solvent R1 according to the types of the solvent R1 and the processing liquid R2.

Modifications

Next, as a modification of the above-described embodiment, descriptions will be made on a method of adjusting the shape of the protective film R by changing the configuration of the processing liquid supply 32 and changing the configuration of the processing liquid R2.

In the above-described embodiment, descriptions have been made on the point that the Marangoni convection in the processing liquid R2 applied to the surface of the workpiece W is considered as the cause of forming the hump R21. As described above, in the Marangoni convection, when the processing liquid R2 volatilizes, the processing liquid moves laterally (horizontally) toward the contour portion of the processing liquid R2. When the lateral movement of the solid component of the processing liquid is the cause of forming the hump R21, it is conceivable to suppress the formation of the hump R21 by suppressing the lateral movement of the solid component of the processing liquid. That is, the formation of the hump R21 is suppressed by inhibiting the Marangoni convection in the processing liquid R2. As an example of the method of inhibiting Marangoni convection, a method of generating Benard convection in the processing liquid R2 may be considered. Benard convection occurs inside a fluid when a temperature or concentration gradient is formed in the fluid. In the processing liquid R2, it is conceivable to form a concentration gradient by utilizing the volatility of the solvent. As an example, it is conceivable to mix two types of solvents having different boiling points in the processing liquid R2 to form a concentration gradient by utilizing the fact that one solvent volatilizes from the surface of the processing liquid R2

As an example, as for two types of solvents having different boiling points, two types of solvents are used according to the relationship of boiling points exemplified as the relationship between the solvent R1 and the solvent in the processing liquid R2. By using a mixture of these solvents to have substantially the same amount as the solvent of the processing liquid R2, the volatilization of the solvent having the low boiling point is promoted more than the volatilization of the solvent having the high boiling point. As a result, in the entire mixture liquid on the workpiece W, a bias occurs between the vicinity of the surface layer of the mixture liquid, which is mainly in contact with the atmosphere, and the lower part thereof with respect to the concentration of the processing liquid R2, and Benard convection occurs to eliminate this. When Benard convection occurs in the entire mixture liquid in this way, the Benard convection and the Marangoni convection interfere with each other in the portion where the Marangoni convection is strongly generated in the mixture liquid. At this time, since the movement of the solid component due to the Marangoni convection that has been generated in the related art is suppressed, it is considered as a result that the hump R21 generated from the Marangoni convection may be made relatively small with respect to the thickness of the other portion of the protective film.

Figure 10:
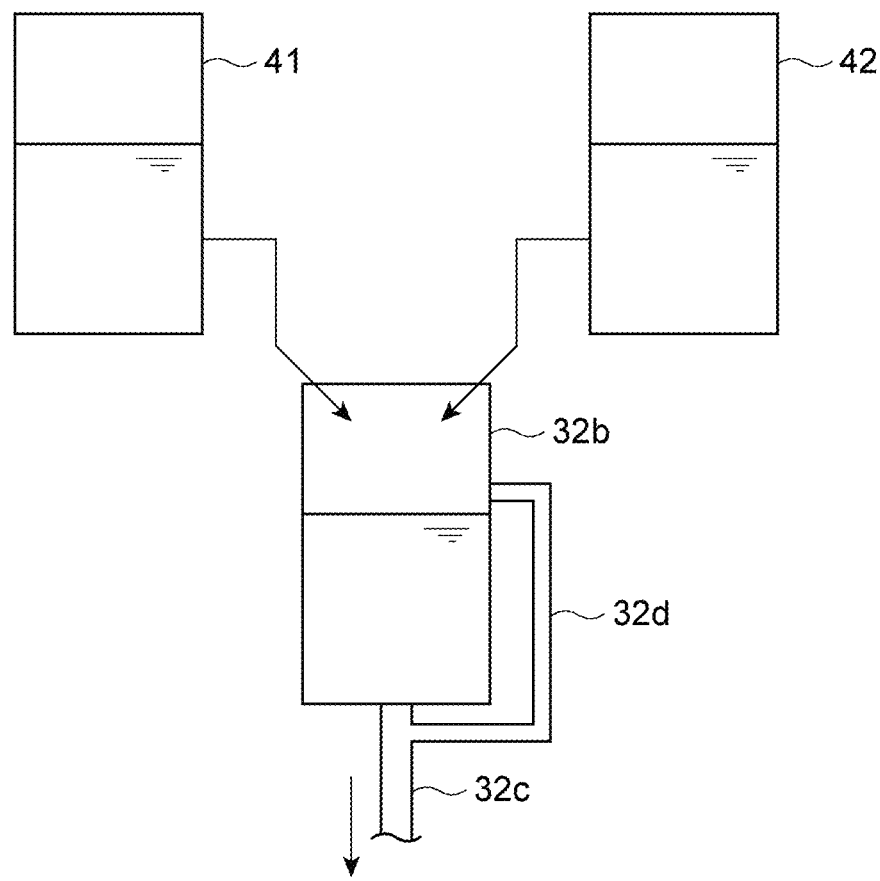
FIG. 10 is a schematic view illustrating a modification of a processing liquid supply source in a coating unit.

FIG. 10 represent an example of an apparatus configuration in which a processing liquid supply source 41 for storing a processing liquid in which solid components are dispersed in one type of solvent, and a solvent supply source 42 for storing another type of solvent are provided upstream of the processing liquid supply source 32b of the processing liquid supply 32 and these solvents are mixed in the processing liquid supply source 32b.

By mixing the processing liquid supplied from the processing liquid supply source 41 and the solvent supplied from the solvent supply source 42, it is possible to prepare the processing liquid R2 in which two types of solvents are mixed. The processing liquid supply source 32b has a function of storing the processing liquid in which the solvents are mixed and supplying the processing liquid to the nozzle 32a. With such a configuration, the mixed concentration of the two types of solvents may be adjusted by using the processing liquid supply source 32b. In order to promote mixing in the processing liquid supply source 32b, a supply route may be devised, such as, for example, supplying the processing liquid from the processing liquid supply source 41 to the processing liquid supply source 32b by turning right, and supplying the processing liquid from the processing liquid supply source 42 to the processing liquid supply source 32b by turning left. In addition, solvent separation may occur in a liquid in which two types of solvents are mixed. Therefore, as illustrated in FIG. 10, a circulation flow path 32d for the processing liquid supply source 32b may be provided, and the liquid in the processing liquid supply source 32b may be circulated and mixed so that the two types of solvents are mixed.

The processing liquid R2, which is a mixture of the two types of solvents as described above, may be supplied from the nozzle 32a to the workpiece W so as to form the protective film R, and then the protective film R formed on the workpiece W may be evaluated to adjust the mixing ratio of the solvent. Generally, it is considered that Benard convection is likely to occur when two types of solvents are mixed in the same amount. However, after confirming the shape of the actually formed protective film R, the mixing ratio of the solvent may be adjusted.

Reaction

According to the above-mentioned substrate processing apparatus (coating/developing device 2) and substrate processing method, the solvent R1, which is a molding solvent supplied inside the region of the surface of the workpiece W to which the processing liquid is supplied, is brought into contact with the interface on the center of the workpiece W of the processing liquid R2 supplied to the peripheral edge. Thus, the hump R21 formed when the processing liquid R2 is supplied by the solvent R1 may be removed. Therefore, the film thickness of the protective film R as the processing film formed by the processing liquid R2 may be made uniform.

When the processing liquid R2 is applied to the peripheral edge of the workpiece W by the scan-in step and the scan-out step as in the above-described method of supplying the processing liquid R2, the hump R21 is likely to be formed. In the related art, a method of supplying a solvent has been adopted to crush the hump R21 from above the hump R21. Since the hump R21 on the workpiece W is extremely small, when a solvent is supplied from above, not only the hump R21 but also the peripheral processing liquid may be removed. Further, even when the hump R21 is removed, when the thickness of the protective film R is not uniform, there is a possibility that the subsequent step of removing the protective film R may not be properly performed. According to the above-described configuration, the solvent R1 which is the molding solvent supplied to the center of the workpiece W is brought into contact with the interface in the center of the workpiece W in the processing liquid R2 in which the hump R21 is easily formed. As a result, the processing liquid R2 is dissolved by the solvent R1, and the protective film R as the processing film may be formed in a state where the hump R21 has a low profile. Therefore, the film thickness of the processing film may be made uniform.

When the solvent R1 is brought into contact with the interface of the processing liquid R2 in the center of the workpiece W while rotating the workpiece W as in the substrate processing apparatus (coating/developing device 2) and the substrate processing method, the dissolved processing liquid R2 scatters outward together with the solvent R1 as the workpiece W rotates. Therefore, it is possible to suppress the processing liquid R2 derived from the hump R21 from remaining on the surface of the workpiece W.

Further, when the molding solvent has a lower volatility than the solvent contained in the processing liquid R2 as described above, the contact time between the processing liquid and the molding solvent may be made longer, and molding with the molding solvent may be promoted. Therefore, the film thickness of the processing film may be made more uniform.

Further, when the solvent R1 as a molding solvent is supplied to the surface of the workpiece W before the processing liquid R2 is supplied, the processing liquid R2 may be supplied after the solvent R1 supplied to the surface of the workpiece W is volatilized to a certain extent. Therefore, the solvent R1 may be brought into contact with the processing liquid R2 while adjusting the amount of the solvent R1 remaining on the workpiece W. Therefore, the film thickness of the processing film may be adjusted in more detail.

When the rotation speed of the workpiece W is reduced after the solvent R1 as the molding solvent is supplied and before the processing liquid R2 is supplied, the amount of molding solvent that comes into contact with the processing liquid may be adjusted by utilizing the change in the rotation speed. This rotation speed adjustment process may be omitted.

Further, by changing the interval between the supply of the solvent R1 as the molding solvent and the supply of the processing liquid R2, the amount of the molding solvent in contact with the processing liquid R2 on the workpiece W may be adjusted. Therefore, by adjusting the interval between the supply of the solvent R1 and the supply of the processing liquid R2 according to the volatility and supply amount of the solvent R1, the molding of the processing film by the solvent R1 may be performed more accurately.

As described in the above-described modification, when a plurality of solvents having different boiling points is mixed in the processing liquid R2, Benard convection occurs in the processing liquid R2 supplied on the workpiece W, and the formation of the hump R21 is suppressed. Therefore, the unevenness of the film thickness of the processing film is further suppressed.

Further, a plurality of solvents having different boiling points may be mixed at substantially the same ratio. In this case, Benard convection is likely to occur, so that the formation of the hump is further suppressed. As described above, the mixing ratio may be adjusted in consideration of other conditions.

Although various embodiments have been described above, the present disclosure is not limited to the embodiments described above, and various omissions, substitutions, and changes may be made. In addition, it is possible to combine the elements in different embodiments to form other embodiments.

For example, the arrangement of each part in the substrate processing apparatus (coating/developing device 2) is an example and is appropriately changed. For example, the configuration for supplying the solvent and the processing liquid to the workpiece W is appropriately changed. Further, the arrangement of the nozzles 31a and 32a, the arrangement of the solvent supply source 31b and the processing liquid supply source 32b, and the arrangement of the pipes 31c and 32c are appropriately changed. Also, the configuration of each part of the coating unit U1 including the spin chuck 21 (substrate holder), the rotation driver 22, the guide ring 25, and the cup 26 is appropriately changed.

In the above-described embodiment, descriptions have been made on the coating unit U1 of the processing module 12 as a unit of forming the protective film R with respect to the peripheral edge of the workpiece W. However, the same functions may be provided in other units of other modules.

Further, in the above-described embodiment, descriptions have been made on the case where the solvent R1 and the processing liquid R2 are supplied while rotating the workpiece W. However, the workpiece W does not have to be rotated when the solvent R1 and the processing liquid R2 are supplied. The movement of the solvent R1 to the outer periphery may be performed by the rotation of the workpiece W.

According to the substrate processing method according to the embodiment, a technique for forming a processing film having a more uniform film thickness on the peripheral edge of the substrate is provided From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims

What is claimed is:

1. A substrate processing method comprising:
supplying a molding solvent, configured to dissolve a processing liquid, to a center of a substrate while rotating the substrate, to spread the molding solvent across a first region of a surface of the substrate in a radial direction of the substrate;
supplying the processing liquid to a peripheral edge of a surface of the substrate to form a processing film on the peripheral edge of the surface of the substrate; and
bringing the molding solvent supplied to the first region into contact with an innermost edge of the processing film, to dissolve an inner portion of the processing film and adjust a surface shape of the processing film.

2. The substrate processing method according to claim 1, wherein the molding solvent has a lower volatility than that of a solvent contained in the processing liquid.

3. The substrate processing method according to claim 2, further comprising:
supplying the molding solvent to the surface of the substrate before supplying the processing liquid.

4. The substrate processing method according to claim 2, further comprising:
reducing a rotation speed of the substrate after the supplying of the molding solvent and before the supplying of the processing liquid.

5. The substrate processing method according to claim 4, wherein an interval between the supplying of the molding solvent and the supplying of the processing liquid is determined according to a volatility and supply amount of the molding solvent.

6. The substrate processing method according to claim 5, wherein a plurality of solvents having different boiling points is mixed in the processing liquid.

7. The substrate processing method according to claim 6, wherein the plurality of solvents having different boiling points are mixed at a substantially same ratio.

8. The substrate processing method according to claim 1, further comprising:
supplying the molding solvent to the surface of the substrate before the supplying of the processing liquid.

9. The substrate processing method according to claim 8, further comprising:
reducing a rotation speed of the substrate after the supplying of the molding solvent and before the supplying of the processing liquid.

10. The substrate processing method according to claim 8, wherein an interval between the supplying of the molding solvent and the supplying of the processing liquid is determined according to a volatility and supply amount of the molding solvent.

11. The substrate processing method according to claim 1, wherein a plurality of solvents having different boiling points is mixed in the processing liquid.

12. The substrate processing method according to claim 11, wherein the plurality of solvents having different boiling points are mixed at a substantially same ratio.

13. A substrate processing apparatus comprising:
a substrate holder configured to rotatably hold a substrate;
a processing liquid supply configured to supply a processing liquid to a surface of the substrate;
a solvent supply configured to supply a molding solvent to a surface of the substrate; and
a controller configured to control the substrate holder, the processing liquid supply, and the solvent supply to perform a process including:
supplying a molding solvent, configured to dissolve a processing liquid, to a center of a substrate while rotating the substrate, to spread the molding solvent across a first region of a surface of the substrate in a radial direction of the substrate;
supplying the processing liquid to a peripheral edge of a surface of the substrate to form a processing film on the peripheral edge of the surface of the substrate; and
bringing the molding solvent supplied to the first region into contact with an innermost edge of the processing film, to dissolve an inner portion of the processing film and adjust a surface shape of the processing film.

14. The substrate processing apparatus according to claim 13, wherein the molding solvent supplied from the solvent supply has a lower volatility than that of a solvent contained in the processing liquid supplied from the processing liquid supply.

15. The substrate processing apparatus according to claim 14,
wherein the controller controls an interval between supplying of the molding solvent from the solvent supply and supplying of the processing liquid from the processing liquid supply according to a volatility and supply amount of the molding solvent.

16. The substrate processing apparatus according to claim 13,
wherein the controller controls an interval between supplying of the molding solvent from the solvent supply and supplying of the processing liquid from the processing liquid supply according to a volatility and supply amount of the molding solvent.

* * * * *